(12) United States Patent
Matsubara

(10) Patent No.: US 8,193,582 B2
(45) Date of Patent: Jun. 5, 2012

(54) SEMICONDUCTOR DEVICE AND METHOD OF MANUFACTURING THE SAME

(75) Inventor: Yoshihisa Matsubara, Kanagawa (JP)

(73) Assignee: Renesas Electronics Corporation, Kawasaki-shi, Kanagawa (JP)

(*) Notice: Subject to any disclaimer, the term of this patent is extended or adjusted under 35 U.S.C. 154(b) by 215 days.

(21) Appl. No.: 12/458,197

(22) Filed: Jul. 2, 2009

(65) Prior Publication Data
US 2010/0006932 A1    Jan. 14, 2010

(30) Foreign Application Priority Data
Jul. 9, 2008    (JP) .................... 2008-179601

(51) Int. Cl.
*H01L 27/088*    (2006.01)
*H01L 21/8242*    (2006.01)

(52) U.S. Cl. ............... 257/334; 438/270; 257/E27.06; 257/E21.646

(58) Field of Classification Search .......... 438/270; 257/334, E27.06, E21.646
See application file for complete search history.

(56) References Cited

U.S. PATENT DOCUMENTS

| | | | | |
|---|---|---|---|---|
| 6,906,398 B2 * | 6/2005 | Yeo et al. | ............... | 257/500 |
| 7,087,956 B2 | 8/2006 | Umebayashi | | |
| 2002/0135030 A1 | 9/2002 | Horikawa | | |
| 2003/0011032 A1 | 1/2003 | Umebayashi | | |
| 2003/0096501 A1 | 5/2003 | Ootsuka et al. | | |
| 2007/0082440 A1 | 4/2007 | Shiratake | | |
| 2007/0096204 A1 | 5/2007 | Shiratake | | |

FOREIGN PATENT DOCUMENTS

| | | |
|---|---|---|
| CN | 1420546 A | 5/2003 |
| CN | 1527362 A | 9/2004 |
| JP | 2002-184958 A | 6/2002 |
| JP | 2002-270797 A | 9/2002 |
| JP | 2002-280461 A | 9/2002 |
| JP | 2007-123551 A | 5/2007 |
| JP | 2007-134674 A | 5/2007 |

OTHER PUBLICATIONS

Chinese Office Action dated Dec. 17, 2010, with English translation.

* cited by examiner

*Primary Examiner* — A. Sefer
*Assistant Examiner* — Monica D Harrison
(74) *Attorney, Agent, or Firm* — McGinn IP Law Group, PLLC

(57) ABSTRACT

A semiconductor device, including: a first transistor formed on a substrate and including an Hf contained film as its gate insulating film; and a second transistor formed on said substrate and having the same conductive type as that of said first transistor, said second transistor including a silicon oxide film and not including an Hf contained film as its gate insulating film is provided.

14 Claims, 14 Drawing Sheets

US 8,193,582 B2

SEMICONDUCTOR DEVICE AND METHOD OF MANUFACTURING THE SAME

This application is based on Japanese patent application NO. 2008-179601, the content of which is incorporated hereinto by reference.

BACKGROUND

1. Technical Field

The present invention relates to a semiconductor device and a method of manufacturing the semiconductor device.

2. Related Art

In recent years, as a material that constitutes a semiconductor device, utilization of a high-dielectric-constant film called high-k has been examined. Representative examples of a high-k material may include oxides including Zr and Hf. If these materials are used for a gate insulating film of a MOSFET, a high-speed transistor can be realized. Japanese Unexamined patent publication NO. 2002-280461 discloses a CMOS device that includes an nMOSFET and a pMOSFET using the high-k material.

Further, as a method of forming a metal gate, a gate-last (damascene gate) process that forms a gate electrode after forming a source/drain may be adopted. Japanese Unexamined patent publication NOs. 2007-134674, 2007-123551, 2002-270797, and 2002-184958 disclose structures of a metal gate. If this process is used, a metal material where patterning is difficult can be used as an electrode material.

The present inventor has recognized as follows. There is a type of transistor that constitutes for example a Dynamic Random Access Memory (DRAM). In such type of transistor, it may be preferable to maintain an excellent holding characteristic rather than the having high-speed characteristic. Therefore, in such type of transistor, it may be preferable to use a thick silicon oxide film as a gate dielectric film rather than using high-k dielectric film as a gate dielectric film.

SUMMARY

In one embodiment, there is provided a semiconductor device, including: a first transistor formed on a substrate and including an Hf contained film as its gate insulating film; and a second transistor formed on the substrate and having the same conductive type as that of the first transistor, the second transistor including a silicon oxide film and not including an Hf contained film as its gate insulating film.

According to this configuration, each of a transistor where a high-speed characteristic is needed and a transistor where a holding characteristic or a high-voltage characteristic rather than the high-speed characteristic is needed can be made to have a preferable characteristic. That is, as the transistor where the high-speed characteristic is needed, a first transistor that includes an Hf contained film to be a high-dielectric-constant film as a gate insulating film can be used. Meanwhile, as the transistor where the holding characteristic or the high-voltage characteristic rather than the high-speed characteristic is needed, a second transistor that includes a silicon oxide film as a gate insulating film can be used.

In another embodiment, there is provided a method of manufacturing a semiconductor device including first and second transistors that are formed on a substrate and have the same conductive type, including: selectively forming an Hf contained film in a first region where the first transistor is to be formed; forming a dummy gate electrode made of polysilicon in the first region and a second region where the second transistor is to be formed, and etching the Hf contained film in a gate shape using the dummy gate electrode as a mask, in the first region; implanting impurities in the substrate using the dummy gate electrode as the mask and performing heat treatment to form a source/drain region; forming an insulating film to bury the dummy gate electrode on the substrate; planarizing the insulating film and exposing a top surface of the dummy gate electrode; forming a second trench in the insulating film to expose the substrate to a bottom portion of the second trench by removing the dummy gate electrode of the second region using a first mask covering a region other than the second region; after removing the first mask, forming a silicon oxide film on an exposed surface of the substrate in the second region; forming a first trench in the insulating film such that the Hf contained film remains at a bottom portion of the first trench by removing the dummy gate electrode of the first region using a second mask covering a region other than the first region; after removing the second mask, forming a metal film on an entire surface of the substrate to bury the first trench and the second trench by the metal film; and removing the metal film exposed to the outside of the first trench and the second trench using a chemical mechanical polishing process to form a gate electrode in each of the first trench and the second trench.

According to the examination result of the present inventor, when a process of exposing the substrate to the bottom portion of the second trench is executed, if the Hf contained film is formed on the substrate, it is difficult to remove the Hf contained film by etching and expose the substrate. This reason is as follows. Since the heat treatment is performed when the impurities are implanted into the substrate to form the source/drain region, crystallization of Hf in the Hf contained film is progressed, and it becomes difficult to remove the Hf contained film by etching. In particular, when the Hf contained film does not contain Si, etching becomes difficult. In the above configuration, at the time of executing a process of forming the source/drain region, since the Hf contained film is not formed in the second region, the surface of the substrate can be easily exposed in the process of exposing the substrate to the bottom portion of the second trench. Meanwhile, since the first transistor is configured to include the Hf contained film, when the high-speed characteristic is needed, a desired characteristic can be obtained by using the first transistor.

Further, any combination of the individual configurations or various modifications and changes of the method and the device according to the embodiments of the present invention may be included as aspects of the present invention.

According to the present invention, even though transistors have the same conductive type, the transistors can be made to have preferable characteristics in accordance with a utilization purpose.

BRIEF DESCRIPTION OF THE DRAWINGS

The above and other objects, advantages and features of the present invention will be more apparent from the following description of certain embodiments taken in conjunction with the accompanying drawings, in which.

DETAILED DESCRIPTION

Figure 1:
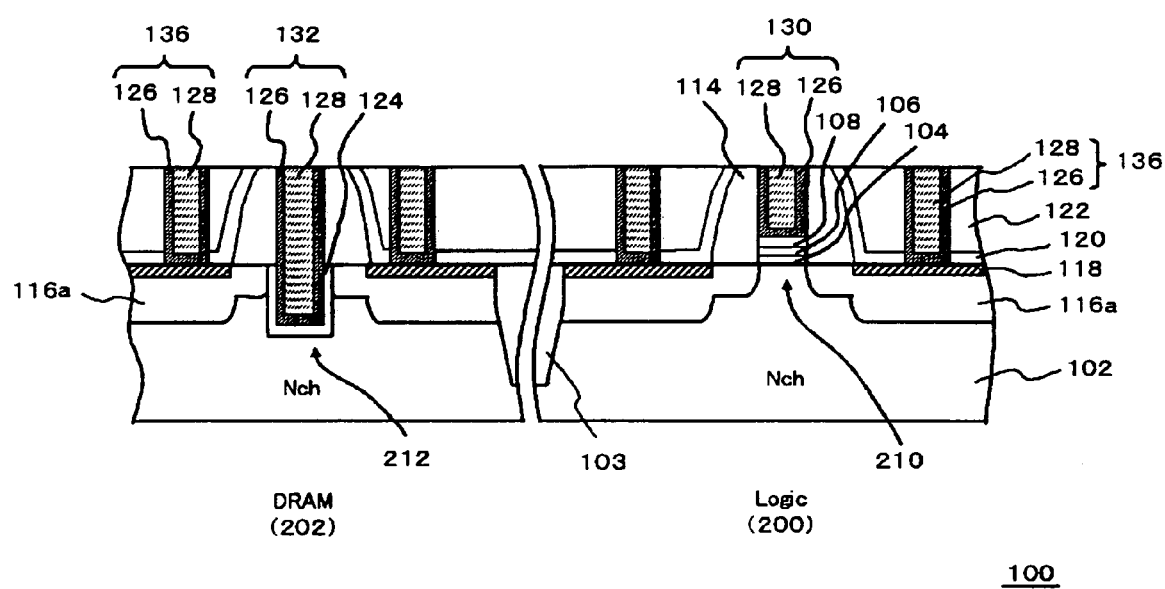
FIG. 1 is a cross-sectional view illustrating the configuration of a semiconductor device according to an embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Hereinafter, the embodiments of the present invention will be described with reference to the accompanying drawings. Further, in all drawings, the same constituent elements will be denoted by the same reference numerals and the description thereof will not be repeated.

In the following embodiments, a semiconductor device is an embedded device in which a logic region and a memory region including a memory such as a Dynamic Random Access Memory (DRAM) formed therein are formed on a substrate. Here, the logic region is formed in a region that is different from the memory region, not a peripheral circuit of a memory element of the memory region. For example, the logic region may be exemplified as a region where a high-speed logic circuit, such as a Central Processing Unit (CPU), is formed.

(First Embodiment)

FIG. 1 is a cross-sectional view illustrating the configuration of a semiconductor device 100 according to this embodiment.

The semiconductor device 100 (substrate) includes a semiconductor substrate 102 where a logic region 200 (described as Logic in the drawings) and a Dynamic Random Access Memory (DRAM) region 202 (described as DRAM in the drawings) serving as a memory region are formed. The semiconductor substrate 102 is, for example, a silicon substrate.

The semiconductor device 100 includes first and second transistors 210 and 212 that are formed on the semiconductor substrate 102 and have the same conductive type. The first transistor 210 is formed in the logic region 200. The second transistor 212 is formed in the DRAM region 202. In this embodiment, the first transistor 210 includes an Hf contained gate insulating film 106 (Hf contained film) as a gate insulating film. Meanwhile, the second transistor 212 includes a silicon oxide film 124 as a gate insulating film but does not include the Hf contained film as the gate insulating film.

On a surface of the semiconductor substrate 102, N-type impurity diffusion regions 116a are formed. The N-type impurity diffusion regions 116a become source/drain regions of the first and second transistors 210 and 212, respectively. Further, on surfaces of the N-type impurity diffusion regions 116a, a silicide layer 118 is formed. Further, a sidewall 114, an insulating film 120, and an interlayer insulating film 122 (insulating film) are formed on the semiconductor substrate 102 so as to bury the gate insulating films and the gate electrodes of the first transistor 210 and the second transistor 212. Further, the interlayer insulating film 122 and the insulating film 120 are provided with contacts 136 that are connected to the individual N-type impurity diffusion regions 116a through the silicide layer 118.

The gate insulating film of the first transistor 210 is composed of a laminated film where a gate insulating film 104, the Hf contained gate insulating film 106, and a threshold value control metal film 108 are formed from the bottom side in this order. The first transistor 210 includes a first gate electrode 130 that is composed of a second metal film 128, which is formed in a first trench formed in the sidewall 114 (insulating film), and a first metal film 126, which covers a bottom surface and side surfaces of the second metal film 128.

The gate insulating film of the second transistor 212 is composed of a silicon oxide film 124. The silicon oxide film 124 of the second transistor 212 may be formed to have an Equivalent Oxide Thickness (EOT) larger than that of the gate insulating film (the gate insulating film 104, the Hf contained gate insulating film 106, and the threshold value control metal film 108) of the first transistor 210. The second transistor 212 includes a second gate electrode 132 that is composed of the second metal film 128, which is formed in a second trench formed in the sidewall 114 (insulating film) and the semiconductor substrate 102, and the first metal film 126, which covers the bottom surface and the side surfaces of the second metal film 128 in the second trench. The silicon oxide film 124 is formed to cover the bottom surface and the side surfaces of the first metal film 126 in the second trench that is formed in the semiconductor substrate 102. As such, in the DRAM region 202, if the second gate electrode 132 is engraved in the semiconductor substrate 102, it is possible to increase a channel length of the second transistor 212. As a result, an off current can be reduced and an excellent holding characteristic can be obtained.

Next, referring to FIGS. 2A to 9, a sequence of manufacturing the semiconductor device 100 according to this embodiment will be described. FIGS. 2A to 9 are process cross-sectional views illustrating a sequence of manufacturing a semiconductor device 100 according to this embodiment. In the following description, the case where the first transistor 210 and a third transistor 214 that has a conductive type opposite to that of the first transistor 210 are formed in the logic region 200 is exemplified. Further, in this embodiment, the first transistor 210, the second transistor 212, and the third transistor 214 are formed using a gate-last process.

In the logic region 200, a P-type channel region (described as Pch in the drawings) and an N-type channel region (described as Nch in the drawings) are provided. Further, the DRAM region 202 may be set as the N-type channel region. These regions are separated by an element separation insulating film 103. The element separation insulating film 103 may be composed of, for example, a silicon oxide film. Further, a liner film, such as a silicon nitride film, may be formed on a bottom surface and side surfaces of the element separation insulating film 103.

Next, the gate insulating film 104 is formed on an entire surface of the semiconductor substrate 102. The gate insulating film 104 may be formed of, for example, TaN. Although not shown herein, before forming the gate insulting film 104, the silicon oxide film may be formed on the entire surface of the semiconductor substrate 102, and the gate insulating film 104 may be formed on the silicon oxide film.

Next, the Hf contained gate insulating film 106 may be formed on the entire surface of the semiconductor substrate 102. In this embodiment, the Hf contained gate insulating film 106 may be composed of a film that contains Hf but does not contain silicon. The Hf contained gate insulating film 106 may be formed of, for example, $HfO_2$ or HfON.

Figure 2A:
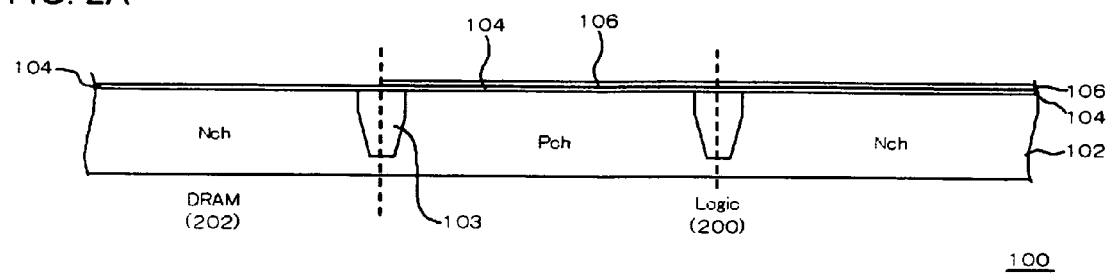
FIGS. 2A and 2B are process cross-sectional views illustrating a sequence of manufacturing a semiconductor device according to an embodiment of the present invention.

Next, a resist film (not shown) that selectively masks the logic region 200 is formed, and the Hf contained gate insulating film 106 of the DRAM region 202 is selectively removed by wet etching using the corresponding resist film as a mask. Next, the resist film is removed (FIG. 2A).

Figure 2B:
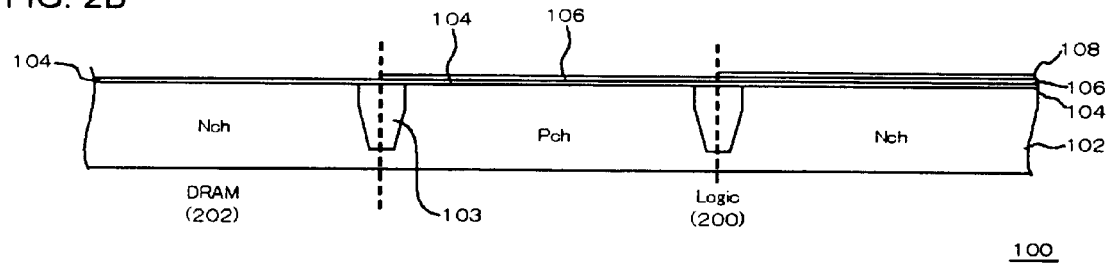

Next, the threshold value control metal film 108 is formed on the entire surface of the semiconductor substrate 102. In this case, the threshold value control metal film 108 may be formed of, for example, La. Next, a resist film (not shown) that selectively masks only the N-type channel region of the logic region 200 is formed, and the P-type channel region of the logic region 200 and the threshold value control metal film 108 of the DRAM region 202 are selectively removed by wet etching using the corresponding resist film as a mask. Next, the resist film is removed (FIG. 2B). Next, $N_2$ is irradiated onto the entire surface of the semiconductor substrate 102.

Figure 3A:
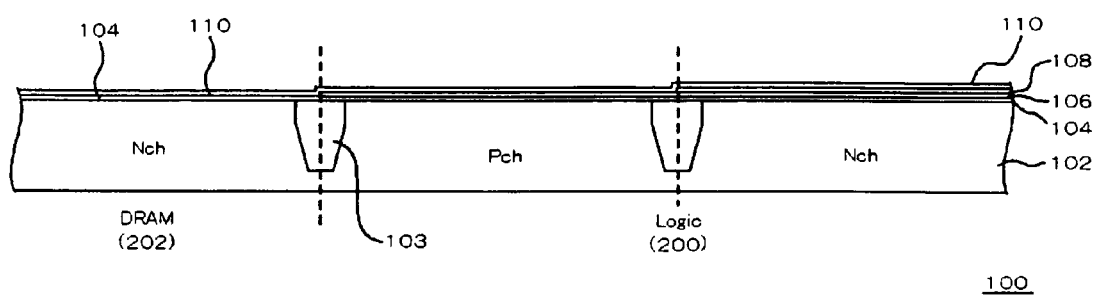
FIGS. 3A and 3B are process cross-sectional views illustrating a sequence of manufacturing a semiconductor device according to an embodiment of the present invention.

Next, an etching stopper film 110 that functions as an etching stopper film when a polysilicon layer is etched hereinafter is formed on the entire surface of the semiconductor substrate 102 (FIG. 3A). The etching stopper film 110 can be formed of, for example, TiN.

Figure 3B:
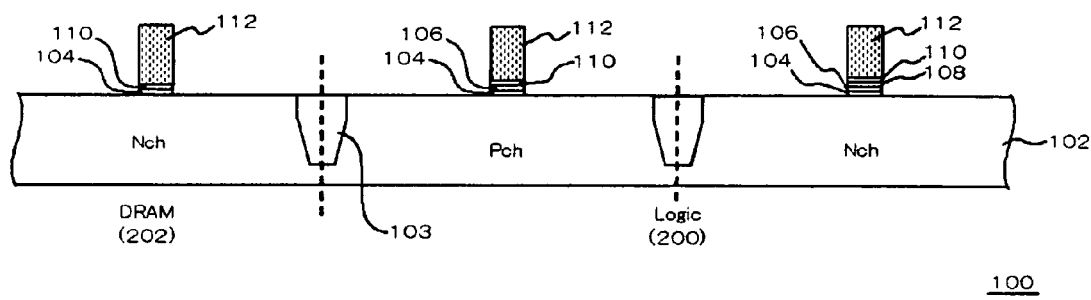

Next, a polysilicon layer 112 is formed on the etching stopper film 110 using, for example, a CVD method. Next, the polysilicon layer 112, the etching stopper film 110, the threshold value control metal film 108, the Hf contained gate insulating film 106, and the gate insulating film 104 are sequentially patterned in a shape of the gate electrode, using an existing lithographic technique (FIG. 3B). As a result, a dummy gate electrode that is composed of the polysilicon layer 112 is formed.

Figure 4A:
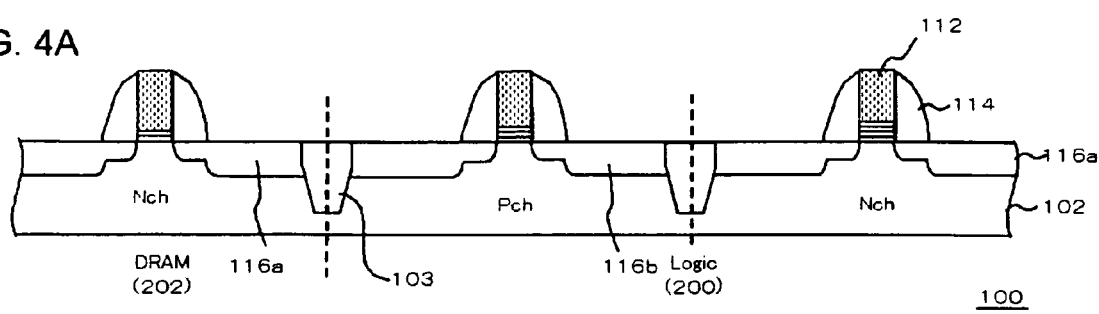
FIGS. 4A and 4B are process cross-sectional views illustrating a sequence of manufacturing a semiconductor device according to an embodiment of the present invention.

Next, ions are implanted into the semiconductor substrate 102 using the polysilicon layer 112, the dummy gate electrode, as a mask, thereby forming an LDD (Lightly Doped Drain) structure of the N-type impurity diffusion region 116a and the P-type impurity diffusion region 116b. Next, the sidewall 114 is formed in the sides of the polysilicon layer 112 and the gate insulating film that are patterned in the shape of the gate electrode. The sidewall 114 may be formed of, for example, a silicon nitride film. Next, using the polysilicon layer 112, the dummy gate electrode, and the sidewall 114 as a mask, impurities are ion-implanted into the semiconductor substrate 102 and heat treatment is performed, thereby forming the N-type impurity diffusion region 116a and the P-type impurity diffusion region 116b (FIG. 4A). The heat treatment can be performed at a temperature of, for example, about 1000° C. Each of the N-type impurity diffusion region 116a and the P-type impurity diffusion region 116b becomes a source/drain region of the transistor.

Figure 4B:
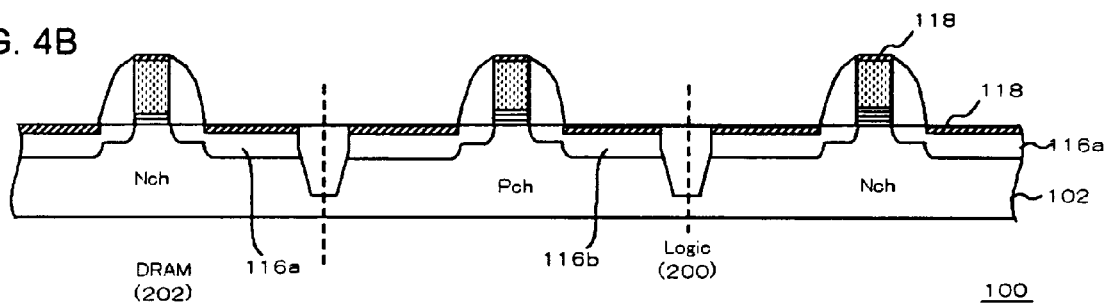

Next, a metal film is formed on the entire surface of the semiconductor substrate 102. In this embodiment, the metal film is formed of nickel or cobalt. The metal film can be formed by sputtering. Next, the heat treatment is performed to make the metal film react to silicon that contacts the corresponding metal film, thereby forming the silicide layer 118. In this case, the silicide layer 118 is formed on the polysilicon layer 112 (FIG. 4B). Next, the non-reactive metal film is removed. The silicide layer 118 may be formed of, for example, NiSi or CoSi.

Figure 5A:
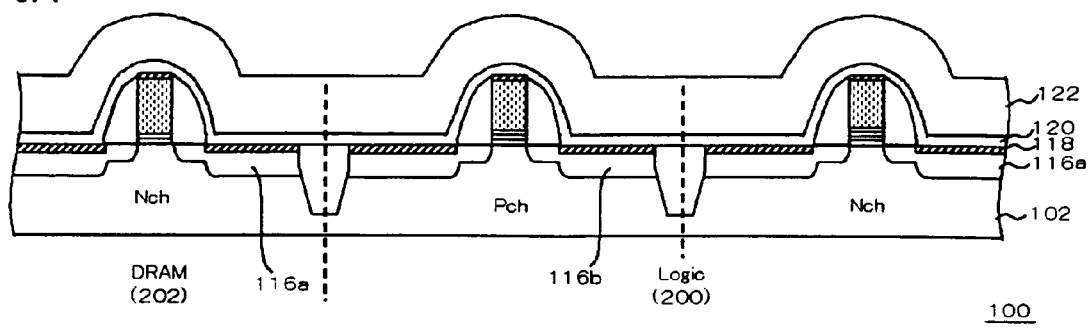
FIGS. 5A and 5B are process cross-sectional views illustrating a sequence of manufacturing a semiconductor device according to an embodiment of the present invention.

Next, the insulating film 120 and the interlayer insulating film 122 are formed on the entire surface of the semiconductor substrate 102 in this order, and the polysilicon layer 112, the dummy gate electrode, and the sidewall 114 are buried (FIG. 5A). The insulating film 120 may be composed of, for example, a silicon nitride film. The interlayer insulating film 122 may be composed of, for example, a silicon oxide film.

Figure 5B:
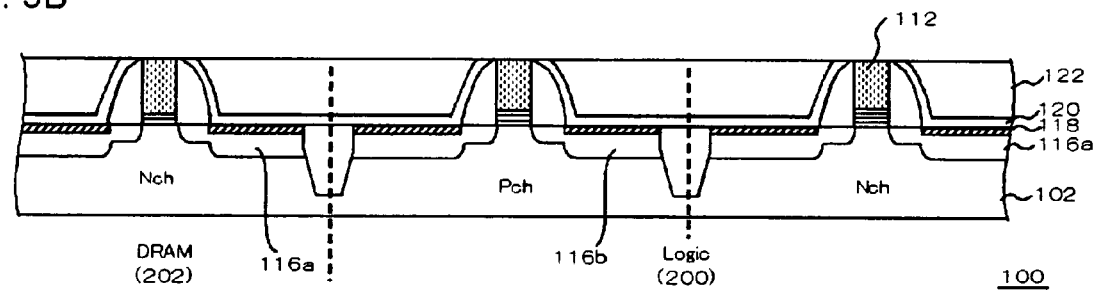

Next, surfaces of the interlayer insulating film 122 and the insulating film 120 are planarized by Chemical Mechanical Polishing (CMP) (FIG. 5B). At this time, the silicide layer 118 that is formed on the surface of the polysilicon layer 112 is also removed, and a top surface of the polysilicon layer 112, the dummy gate electrode, is exposed.

Figure 6A:
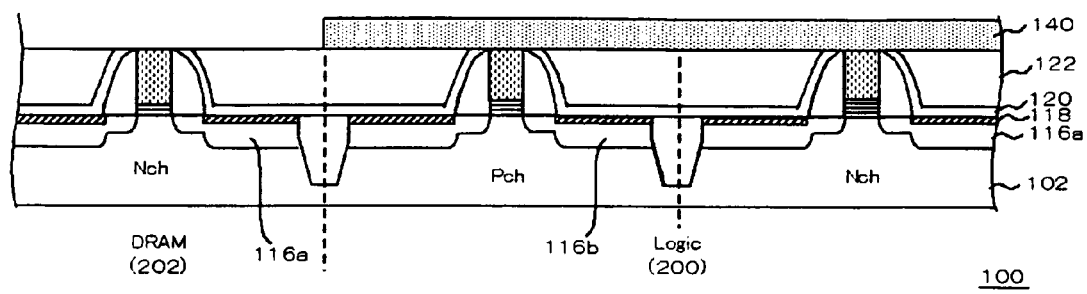
FIGS. 6A and 6B are process cross-sectional views illustrating a sequence of manufacturing a semiconductor device according to an embodiment of the present invention.

Next, a resist film 140 (first mask) that selectively masks the logic region 200 is formed (FIG. 6A). Next, the polysilicon layer 112, the dummy gate electrode, of the DRAM region 202 is selectively removed by wet etching using the resist film 140 as a mask. As a result, the trench 142 (second trench) is formed in the sidewall 114 of the DRAM region 202. At this time, the etching stopper film 110 becomes an etching stopper when the polysilicon layer 112 is etched.

Figure 6B:
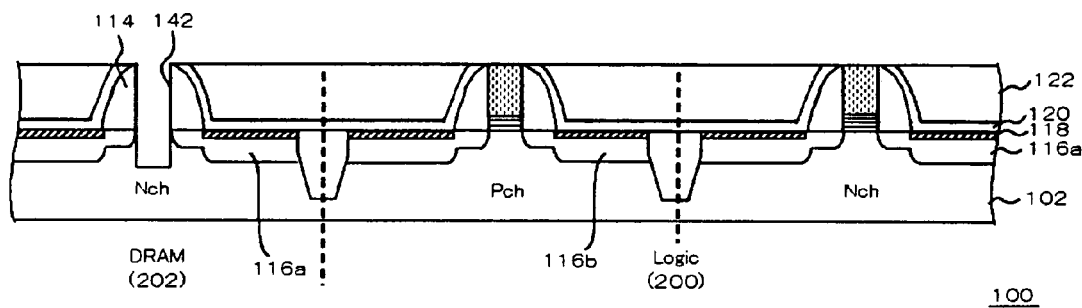

Next, the etching stopper film 110 of the bottom portion of the trench 142 and the gate insulating film 104 are sequentially and selectively removed by dry etching using the sidewall 114 as a mask. Further, the semiconductor substrate 102 at the bottom portion of the trench 142 is also etched. As a result, the trench 142 penetrates the sidewalls 144 to extend to the inside of the semiconductor substrate 102, and the semiconductor substrate 102 is exposed to the bottom portion of the trench 142. In this case, the bottom portion corresponds to the bottom surface of the trench 142 and a sidewall near the bottom surface. Next, the resist film 140 is removed (FIG. 6B).

According to the examination result of the present inventor, when a process of exposing the semiconductor substrate 102 to the bottom portion of the trench 142 is executed, if the Hf contained film is formed on the semiconductor substrate 102, it is difficult to remove the Hf contained film by etching and expose the semiconductor substrate 102. This reason is as follows. Since the heat treatment is performed when the impurities are implanted into the semiconductor substrate 102 to form the N-type impurity diffusion region 116a or the P-type impurity diffusion region 116b, crystallization of Hf in the Hf contained film is progressed, and it becomes difficult to remove the Hf contained film by etching. In particular, when the Hf contained film does not contain Si, etching becomes difficult. In this embodiment, at the time of executing a process of forming the N-type impurity diffusion region 116a or the P-type impurity diffusion region 116b, since the Hf contained gate insulating film 106 is removed from the DRAM region 202, the surface of the semiconductor substrate 102 can be easily exposed in the process of exposing the semiconductor substrate 102 to the bottom portion of the trench 142.

Figure 7A:
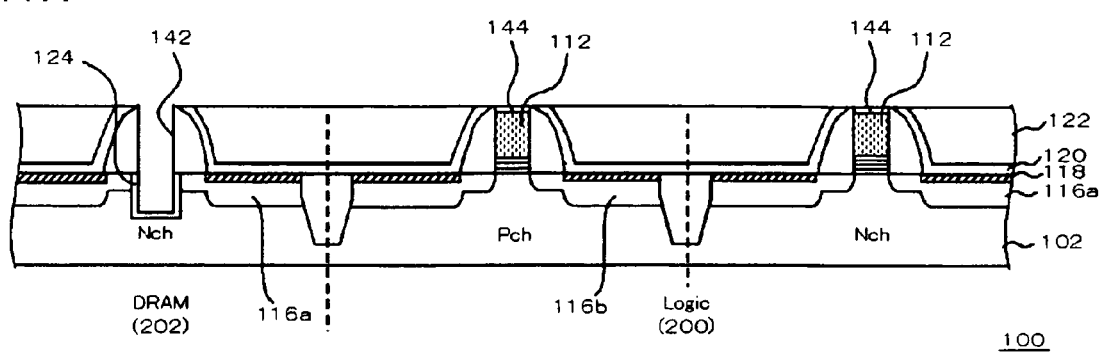
FIGS. 7A and 7B are process cross-sectional views illustrating a sequence of manufacturing a semiconductor device according to an embodiment of the present invention.

Next, the entire surface of the semiconductor substrate 102 is thermally oxidized. At this time, in the bottom portion of the trench 142, since the semiconductor substrate 102 is exposed, an exposed surface of the semiconductor substrate 102 at the bottom portion of the trench 142 is oxidized, and the silicon oxide film 124 is formed (FIG. 7A). The thermal oxidization treatment may be performed for about 10 seconds at a temperature of about 1060° C. using $H_2O_2$. As a result, the excellent crystalline silicon oxide film 124 can be densely formed in the DRAM region 202. In this case, the silicon oxide film 124 may be formed to have a film thickness larger than that of the Hf contained gate insulating film 106. The film thickness of the silicon oxide film 124 may be set as, for example, 100 nm. As a result, it is possible to obtain an excellent holding characteristic.

Further, even in the logic region 200, the top surface of the polysilicon layer 112 is oxidized, and an oxide film 144 is formed. At this time, in the logic region 200, if the Hf contained gate insulating film 106 is exposed to the surface, the Hf contained gate insulating film 106 is also oxidized, which may result in lowering a function as a high-dielectric-constant film. In this embodiment, when the silicon oxide film 124 is formed in the DRAM region 202, the Hf contained gate insulating film 106 can be maintained to have an excellent characteristic, because the Hf contained gate insulating film 106 of the logic region 200 is protected by other layer.

Figure 7B:
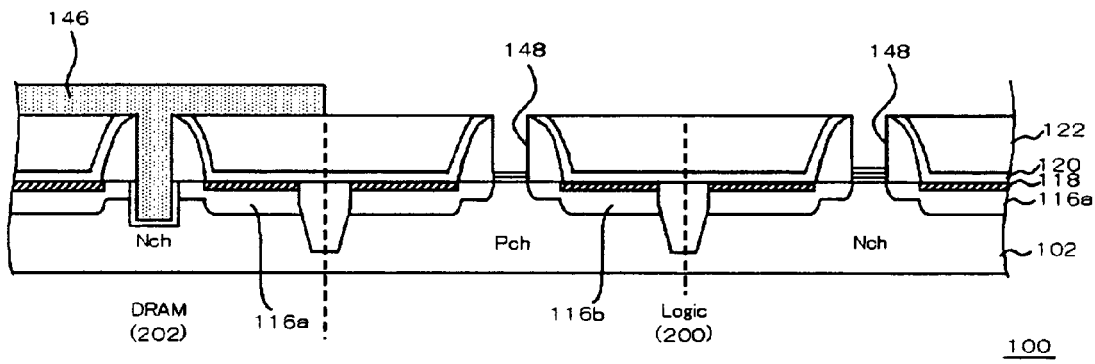
Figure 8A:
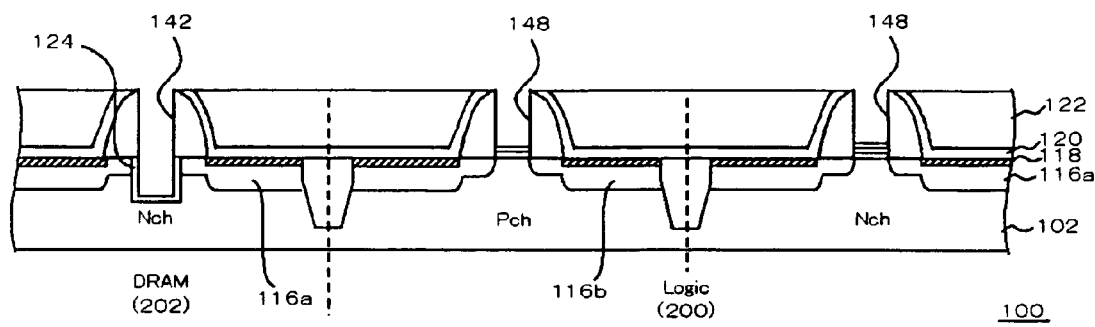
FIGS. 8A and 8B are process cross-sectional views illustrating a sequence of manufacturing a semiconductor device according to an embodiment of the present invention.

Next, a resist film 146 (second mask) that selectively masks the DRAM region 202 is formed. Next, the oxide film 144 of the logic region 200 and the polysilicon layer 112, the dummy gate electrode, are selectively removed by using wet etching using the resist film 146 as a mask. As a result, the trench 148 (first trench) is formed in the sidewall 114 of the logic region 200 (FIG. 7B). At this time, the etching stopper film 110 becomes an etching stopper when the polysilicon layer 112 is etched. Next, the resist film 146 is removed (FIG. 8A).

Next, the first metal film 126 and the second metal film 128 are sequentially formed on the entire surface of the semiconductor substrate 102. The first metal film 126 may be formed of, for example, TiAln. Further, a film thickness of a planarizing portion of the first metal film 126 may be set as, for example, 10 nm. The first metal film 126 is formed to cover the bottom surfaces and the sidewalls of the trench 142 and the trench 148. Even after the first metal film 126 is formed, concave portions are formed in the trench 142 and the trench 148. In this embodiment, the first metal film 126 may be configured to have a bottom surface portion that is formed on the top surface of the gate insulating film (the threshold value control metal film 108 for the first transistor 210 and the silicon oxide film 124 for the second transistor 212) and a peripheral wall portion that is erected from an edge of the bottom surface portion, in the trench 142 and the trench 148. Next, the second metal film 128 is formed on the first metal film 126 to bury the trenches 142 and 148. The second metal film may be formed of, for example, W, Al, or Cu.

Figure 8B:
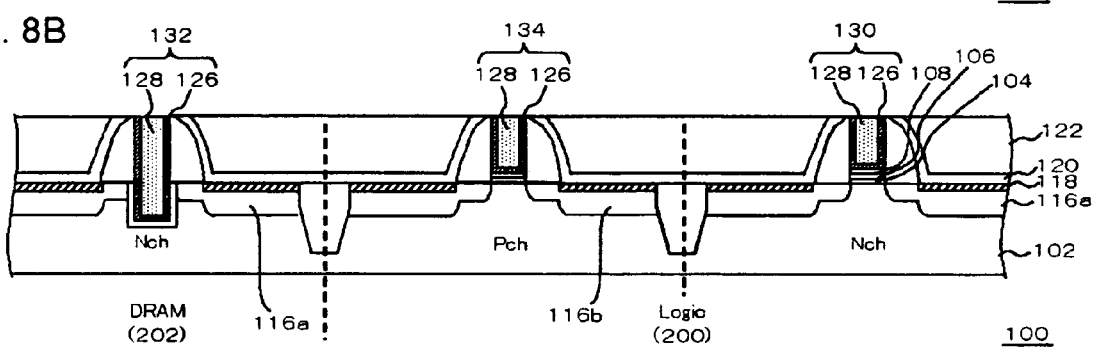

Next, the second metal film 128 and the first metal film 126 that are exposed to the outside of the trench 142 and the trench 148 are removed by CMP (FIG. 8B). As a result, the first gate electrode 130, the third gate electrode 134, and the second gate electrode 132 are formed in the N-type channel region of the logic region 200, the P-type channel region of the logic region 200, and the DRAM region 202, respectively.

Next, the interlayer insulating film 122 and the insulating film 120 are selectively removed, thereby forming contact holes that are connected to the N-type impurity diffusion region 116a and the P-type impurity diffusion region 116b that are the source/drain region. Next, the first metal film 126 and the second metal film 128 are sequentially formed in the contact holes. Similar to the case where the first gate electrode 130 is formed, the second metal film 128 and the first metal film 126 that are exposed to the outside of the contact holes are removed by CMP. As a result, a contact 136 is formed. Further, the contact 136 may be formed of the same material as the material that constitutes the gate electrode or may be formed of a material different from the material. The second metal film 128 that constitutes the contact 136 may be formed of, for example, W, Al, or Cu.

Next, the interlayer insulating film 160 and the interlayer insulating film 162 are sequentially formed on the entire surface of the semiconductor substrate 102. Each of the interlayer insulating film 160 and the interlayer insulating film 162 may be composed of, for example, a low-dielectric-constant film. Further, although not shown in the drawings, another film, such as an etching stopper film, may be provided between the individual interlayer insulating films, in accordance with necessity.

Next, in the interlayer insulating film 160 and the interlayer insulating film 162, a hole to form a plug 186 and a dual damascene wiring groove to form a bit line 184 are formed. At this time, the hole and the dual damascene wiring groove are formed to be connected to the contact 136. Further, in the logic region 200, the hole is formed to be connected to the first gate electrode 130. Next, the hole and the dual damascene wiring groove are buried by a barrier metal film 180 and a metal film 182. The barrier metal film 180 may be formed of, for example, Ti, TiN, W, WN, Ta, or TaN. Further, the barrier metal film 180 may be composed of a laminated film having the structure where TaN and Ta are laminated. The metal film 182 may be formed of, for example, copper.

Next, the metal film 182 and the barrier metal film 180 that are exposed to the outside of the hole and the dual damascene wiring structure are removed by CMP, thereby forming the plug 186 and the bit line 184 that are electrically connected to the contact 136 or the first gate electrode 130.

Next, the interlayer insulating film 172 is formed on the entire surface of the semiconductor substrate 102. Next, a hole that reaches the plug 186 is formed in the interlayer insulating film 172, and the corresponding hole is covered by the barrier metal film 180 and the metal film 182. Next, the metal film 182 and the barrier metal film 180 that are exposed to the outside of the hole are removed by CMP, thereby forming a plug 188.

Next, the interlayer insulating film 174 is formed on the entire surface of the semiconductor substrate 102. Next, in the DRAM region 202, the interlayer insulating film 174 is provided with a concave portion to form a capacitor 198. Next, the concave portion is buried by a lower electrode 192, a capacitive film 194, and an upper electrode 196. As a result, the capacitor 198 is formed. Further, the capacitor may be manufactured using a variety of other configurations and processes.

Figure 9:
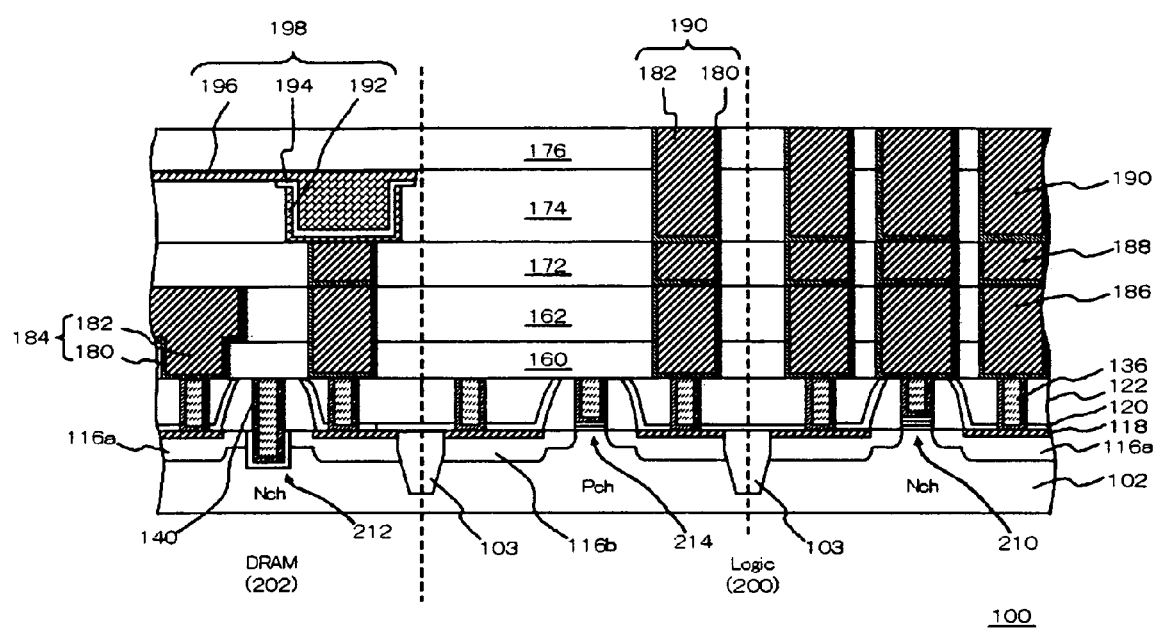
FIG. 9 is a process cross-sectional view illustrating a sequence of manufacturing a semiconductor device according to an embodiment of the present invention.

Next, an interlayer insulating film 176 is formed on the entire surface of the semiconductor substrate 102. In the logic region 200, a hole that reaches the plug 188 is formed in the interlayer insulating film 174 and the interlayer insulating film 176, and the corresponding hole is buried by the barrier metal film 180 and the metal film 182. Next, the metal film 182 and the barrier metal film 180 that are exposed to the outside of the hole are removed by CMP, thereby forming a plug 190. In this way, the semiconductor device 100 that has the configuration shown in FIG. 9 is obtained.

Next, an effect of the semiconductor device 100 according to this embodiment will be described.

According to the semiconductor device 100 in this embodiment, when the process of forming the N-type impurity diffusion region 116a or the P-type impurity diffusion region 116b is executed, the Hf contained gate insulating film 106 is removed form the DRAM region 202. Therefore, in the process of exposing the semiconductor substrate 102 to the bottom surface of the trench 142, it is possible to easily expose the surface of the semiconductor substrate 102. As a result, the trench 142 may be engraved in the semiconductor substrate 102. As such, in the DRAM region 202, if the second gate electrode 132 is engraved in the semiconductor substrate 102, it is possible to increase a channel length of the second transistor 212. As a result, an off current can be reduced, and an excellent holding characteristic can be obtained. Meanwhile, since the first transistor 210 of the logic region 200 is configured to include the Hf contained gate insulating film 106, the first transistor can have a high-speed characteristic.

According to the semiconductor device 100 in this embodiment, each of the transistor where the high-speed characteristic is needed and the transistor where a holding characteristic or a high-voltage characteristic rather than the high-speed characteristic is needed can be made to have a preferable characteristic. That is, as the transistor where the high-speed characteristic is needed, the first transistor 210 that includes the Hf contained film to be a high-dielectric-constant film as the gate insulating film can be used. Meanwhile, as the transistor where the holding characteristic or the high-voltage characteristic rather than the high-speed characteristic is needed, the second transistor 212 that includes the silicon oxide film can be used.

(Second Embodiment)

Figure 10:
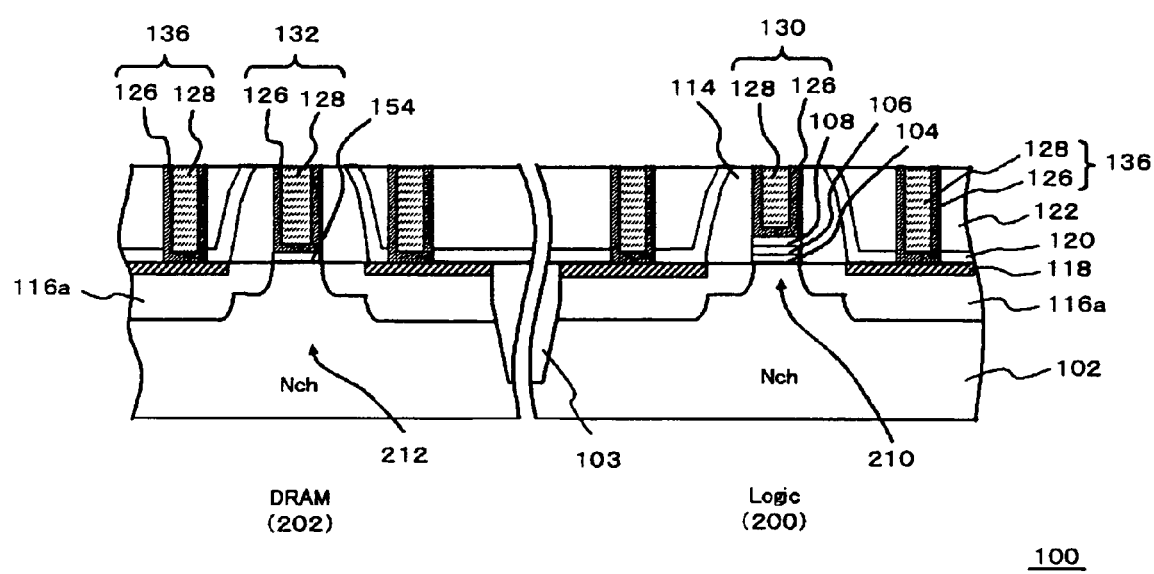
FIG. 10 is a cross-sectional view illustrating the configuration of a semiconductor device according to an embodiment of the present invention.

FIG. 10 is a cross-sectional view illustrating the configuration of a semiconductor device 100 according to this embodiment.

The second embodiment is different from the first embodiment in that the second gate electrode 132 of the second transistor 212 is not formed in the semiconductor substrate 102.

Next, referring to FIGS. 11A to 14, a sequence of manufacturing the semiconductor device 100 according to this embodiment will be described. FIGS. 11A to 14 are process cross-sectional views illustrating a sequence of manufacturing a semiconductor device 100 according to this embodiment. In the following description, the case where the first transistor 210 and a third transistor 214 that has a conductive type opposite to that of the first transistor 210 are formed in the logic region 200 is exemplified.

Figure 11A:
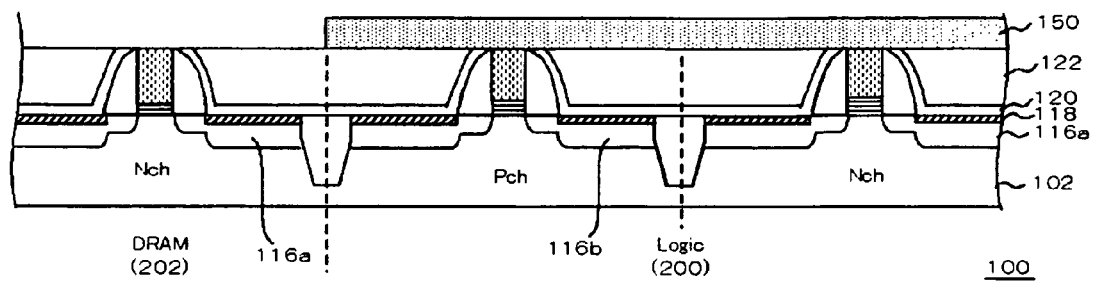
FIGS. 11A and 11B are process cross-sectional views illustrating a sequence of manufacturing a semiconductor device according to an embodiment of the present invention.

Even in this embodiment, since the sequence that is described with reference to FIGS. 2A to 5B is the same as that of the first embodiment, the description thereof will not be repeated. After forming the configuration that is shown in FIG. 5B as described in the first embodiment, a resist film 150 (first mask) that selectively masks the logic region 200 is formed (FIG. 11A). Next, the polysilicon layer 112 that is the dummy gate electrode of the DRAM region 202 is selectively removed by wet etching using the resist film 150 as a mask. As a result, a trench 152 (second trench) is formed in the sidewall 114 of the DRAM region 202. At this time, the etching stopper film 110 becomes an etching stopper when the polysilicon layer 112 is etched.

Figure 11B:
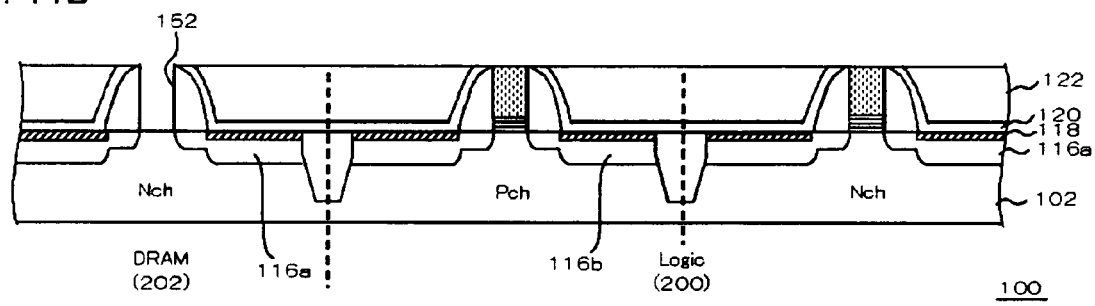

Next, the etching stopper film 110 of the bottom portion of the trench 152 and the gate insulating film 104 are sequentially and selectively removed by dry etching using the sidewall 114 as a mask. In this case, the second embodiment is different from the first embodiment in that the semiconductor substrate 102 is not etched. Next, the resist film 150 is removed (FIG. 11B).

Figure 12A:
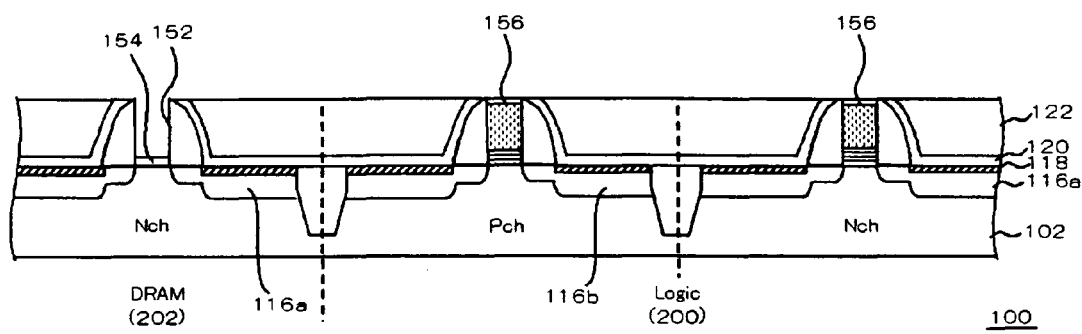
FIGS. 12A and 12B are process cross-sectional views illustrating a sequence of manufacturing a semiconductor device according to an embodiment of the present invention.

Next, the entire surface of the semiconductor substrate 102 is thermally oxidized. At this time, in the bottom portion of the trench 152, since the semiconductor substrate 102 is exposed, an exposed surface of the semiconductor substrate 102 at the bottom portion of the trench 152 is oxidized, and the silicon oxide film 154 is formed (FIG. 12A). The thermal oxidization treatment may be performed for about 10 seconds at a temperature of about 1060° C. using $H_2O_2$. As a result, the excellent crystalline silicon oxide film can be densely formed in the DRAM region 202. In this case, the silicon oxide film 154 may be formed to have a film thickness larger than that of the Hf contained gate insulating film 106. The film thickness of the silicon oxide film 154 may be set as, for example, 100 nm. As a result, it is possible to obtain an excellent holding characteristic. At this time, even in the logic region 200, the top surface of the polysilicon layer 112 is oxidized, and an oxide film 156 is formed.

Figure 12B:
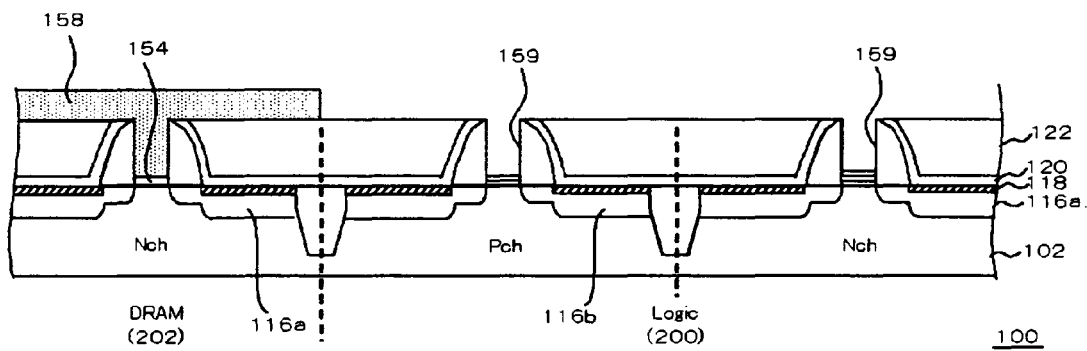
Figure 13A:
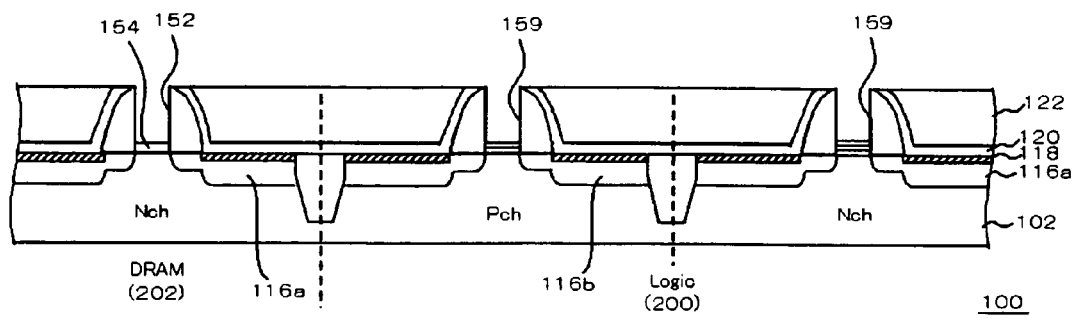
FIGS. 13A and 13B are cross-sectional views illustrating the configuration of a semiconductor device according to an embodiment of the present invention.
Figure 13B:
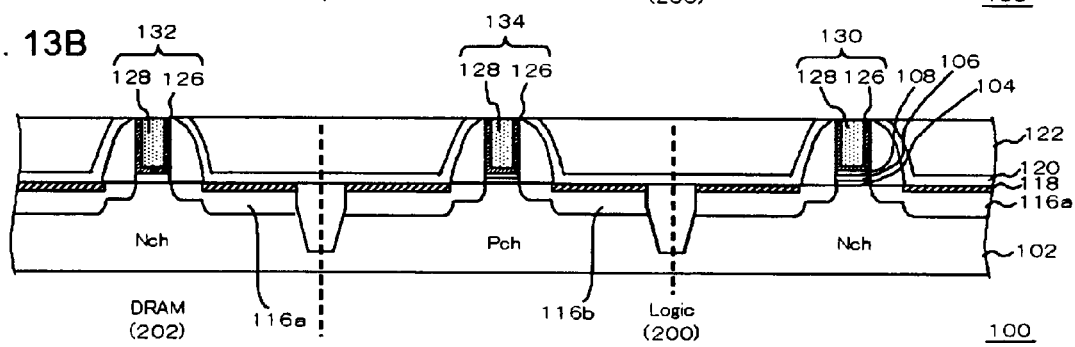

Next, a resist film 158 (second mask) that selectively masks the DRAM region 202 is formed. Next, the oxide film 156 of the logic region 200 and the polysilicon layer 112, the dummy gate electrode, are selectively removed by using wet etching using the resist film 158 as a mask. As a result, the trench 159 (first trench) is formed in the sidewall 114 of the logic region 200 (FIG. 12B). At this time, the etching stopper film 110 becomes an etching stopper when the polysilicon layer 112 is etched. Next, the resist film 158 is removed (FIG. 13A).

In accordance with the same sequence as the sequence that is described with reference to FIG. 8B in the first embodiment, the first metal film 126 and the second metal film 128 are formed in the trench 152 and the trench 159 and are then removed by CMP, thereby forming the first gate electrode 130, the third gate electrode 134, and the second gate electrode 132 in the N-type channel region of the logic region 200, the P-type channel region of the logic region 200, and the DRAM region 202, respectively.

Figure 14:
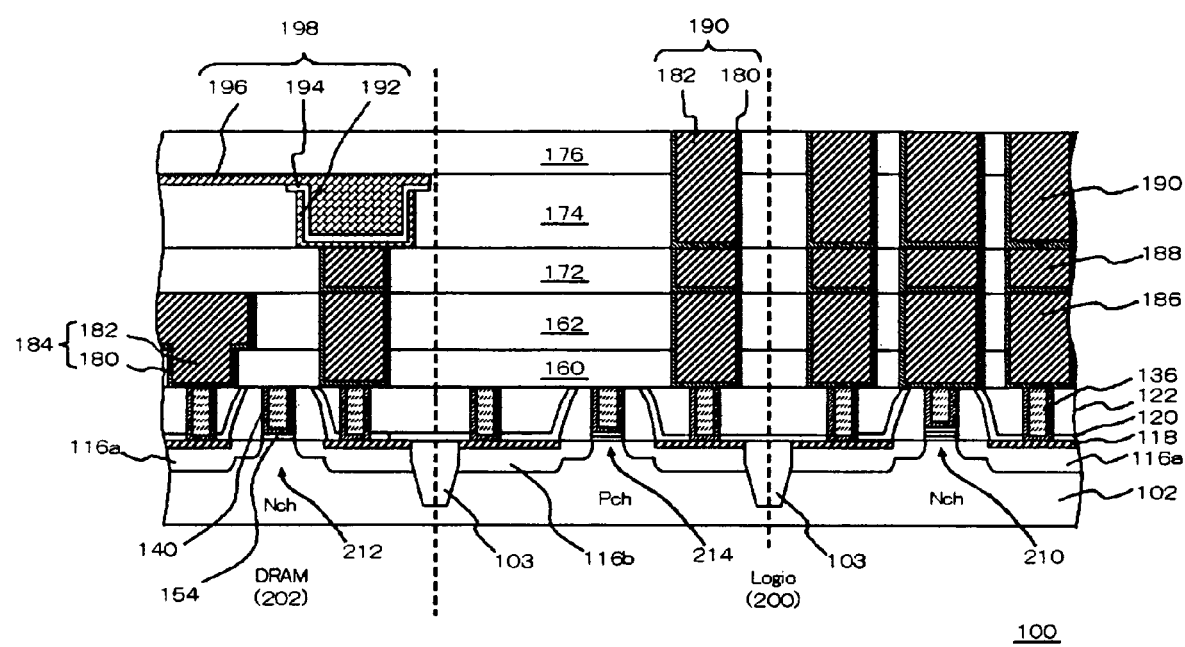
FIG. 14 is a process cross-sectional view illustrating a sequence of manufacturing a semiconductor device according to an embodiment of the present invention.

Next, in accordance with the same sequence as the sequence that is described in the first embodiment, the semiconductor device 100 that has the configuration shown in FIG. 14 is obtained.

Even in this embodiment, at the time of executing a process of forming the N-type impurity diffusion region 116a or the P-type impurity diffusion region 116b, since the Hf contained gate insulating film 106 is removed from the DRAM region 202, the surface of the semiconductor substrate 102 can be easily exposed in a process of exposing the semiconductor substrate 102 to the bottom portion of the trench 152. As a result, the surface of the semiconductor substrate 102 can be easily exposed, and the silicon oxide film 154 having excellent crystalline can be densely formed on the surface of the semiconductor substrate 102. Meanwhile, since the first transistor 210 of the logic region 200 is configured to include the Hf contained gate insulating film 106, the first transistor can have a high-speed characteristic.

According to the semiconductor device 100 in this embodiment, each of the transistor where the high-speed characteristic is needed and the transistor where a holding characteristic or a high-voltage characteristic rather than the high-speed characteristic is needed can be made to have a preferable characteristic. That is, as the transistor where the high-speed characteristic is needed, the first transistor 210 that includes the Hf contained film to be a high-dielectric-constant film as the gate insulating film can be used. Meanwhile, as the transistor where the holding characteristic or the high-voltage characteristic rather than the high-speed characteristic is needed, the second transistor 212 that includes the silicon oxide film can be used.

The embodiments of the present invention have been described with reference to the accompanying drawings.

However, the embodiments are only exemplified and a variety of other configurations can be adopted.

In the above-described embodiments, the first transistor 210 is formed in the logic region 200 and the second transistor 212 is formed in the DRAM region 202. However, both the first transistor 210 and the second transistor 212 may be formed in either the logic region 200 or the DRAM region 202. For example, in the logic region 200, the second transistor 212 may be used as the transistor where the high-voltage characteristic is needed and the first transistor 210 may be used as the transistor where the high-speed characteristic is needed.

It is apparent that the present invention is not limited to the above embodiment, and may be modified and changed without departing from the scope and spirit of the invention.

What is claimed is:

1. A semiconductor device, comprising:
a first transistor formed on a substrate, said first transistor comprising a first gate insulating film, said first gate insulating film comprising an Hf contained film;
a second transistor formed on said substrate, said second transistor comprising a same conductive type as a conductive type of said first transistor, said second transistor comprising a second gate insulating film including a silicon oxide film and not including an Hf contained film;
wherein said second transistor includes a second gate electrode that is composed of a first metal film and a second metal film which are formed in a first trench, said first metal film covering a bottom surface and side surfaces of said second metal film.

2. The semiconductor device according to claim 1, wherein the second gate insulating film of said second transistor has an Equivalent Oxide Thickness (EOT) that is larger than an EOT of the first gate insulating film of said first transistor.

3. The semiconductor device according to claim 1, further comprising a second trench formed in an insulating film,
wherein said first transistor includes a first gate electrode that is composed of said first metal film and said second metal film which are formed in said second trench, said first metal film covering a bottom surface and side surfaces of said second metal film.

4. The semiconductor device according to claim 3, wherein said first trench is formed in said insulating film to penetrate said insulating film to be formed also in said substrate.

5. The semiconductor device according to claim 4, wherein said second trench is formed only in said insulating film.

6. The semiconductor device according to claim 4, wherein said silicon oxide film of said second transistor covers a bottom surface and side surfaces of said first metal film, in said first trench that is formed in said substrate.

7. The semiconductor device according to claim 4, further comprising an embedded device in which a memory region and a logic region are formed on said substrate,
wherein said first transistor is formed in said logic region, and
wherein said second transistor is formed in said memory region.

8. The semiconductor device according to claim 1, further comprising an embedded device in which a memory region and a logic region are formed on said substrate, and
wherein said first transistor is formed in said logic region, and said second transistor is formed in said memory region.

9. A method of manufacturing a semiconductor device including first and second transistors that are formed on a substrate and have a same conductive type, said method comprising:
selectively forming an Hf contained film in a first region where said first transistor is to be formed;
forming a dummy gate electrode comprising polysilicon in said first region and a second region where said second transistor is to be formed, and etching said Hf contained film in a gate shape using said dummy gate electrode as a mask, in said first region;
implanting impurities in said substrate using said dummy gate electrode as the mask and performing a heat treatment to form a source/drain region;
forming an insulating film to bury said dummy gate electrode on said substrate;
planarizing said insulating film and exposing a top surface of said dummy gate electrode;
forming a second trench in said insulating film to expose said substrate to a bottom portion of said second trench by removing said dummy gate electrode of said second region using a first mask covering a region other than said second region;
forming a silicon oxide film, after removing said first mask, on an exposed surface of said substrate in said second region;
forming a first trench in said insulating film such that said Hf contained film remains at a bottom portion of said first trench by removing said dummy gate electrode of said first region using a second mask covering a region other than said first region;
forming a metal film, after removing said second mask, on an entire surface of said substrate to bury said first trench and said second trench by said metal film; and
removing said metal film exposed to the outside of said first trench and said second trench using a chemical mechanical polishing process to form a gate electrode in each of said first trench and said second trench.

10. The method according to claim 9, wherein, in said forming a second trench in said insulating film, said second trench is formed in said insulating film to penetrate said insulating film to be formed also in said substrate.

11. The method according to claim 9, wherein said selectively forming the Hf contained film includes:
forming said Hf contained film on the entire surface of said substrate; and
selectively removing said Hf contained film that is formed in said second region.

12. The method according to claim 9, wherein said substrate comprises a silicon substrate, and
wherein, in said forming the silicon oxide film, the exposed surface of said substrate is oxidized to form a silicon oxide film.

13. The method according to claim 9, wherein, in said forming the silicon oxide film, said silicon oxide film is formed such that the insulating film of the second transistor has an Equivalent Oxide Thickness (EOT) larger than an EOT of the insulating film of said first transistor.

14. The method according to claim 9, wherein said semiconductor device further comprises an embedded device in which a memory region and a logic region are formed on said substrate, said first transistor is formed in said logic region, and
wherein said second transistor is formed in said memory region.

* * * * *